(12) United States Patent
Yanagihara et al.

(10) Patent No.: US 6,400,170 B1
(45) Date of Patent: Jun. 4, 2002

(54) HIGH CURRENT EXAMINING STRUCTURE FOR A CIRCUIT PROTECTIVE ELEMENT

(75) Inventors: Takashi Yanagihara; Satoshi Ishikawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/379,105

(22) Filed: Aug. 23, 1999

(30) Foreign Application Priority Data

Aug. 26, 1998 (JP) .......................................... 10-240003
Nov. 9, 1998 (JP) .......................................... 10-318055

(51) Int. Cl.$^7$ ............................................. G01R 31/02
(52) U.S. Cl. ..................... 324/756; 324/754; 324/755; 324/756; 324/758
(58) Field of Search ................................. 324/549, 666, 324/758, 754, 755, 756, 525, 765; 257/48

(56) References Cited

U.S. PATENT DOCUMENTS

| | | | | |
|---|---|---|---|---|
| 3,824,461 A | * | 7/1974 | Preilschat ................... | 324/666 |
| 3,832,632 A | * | 8/1974 | Ardezzone ................... | 324/756 |
| 4,360,142 A | * | 11/1982 | Carpenter et al. ......... | 228/123.1 |
| 4,479,088 A | * | 10/1984 | Stopper ...................... | 324/525 |
| 4,526,859 A | * | 7/1985 | Christensen et al. ........ | 430/314 |
| 4,807,161 A | * | 2/1989 | Comfort et al. ............. | 702/121 |
| 5,334,857 A | * | 8/1994 | Mennitt e tal. ............... | 257/48 |
| 5,412,539 A | * | 5/1995 | Elwell et al. ................ | 361/792 |
| 5,574,386 A | * | 11/1996 | Beaumont et al. .......... | 324/765 |
| 5,719,449 A | * | 2/1998 | Strauss ....................... | 257/786 |
| 5,751,554 A | * | 5/1998 | Williams et al. ............. | 361/760 |
| 6,184,587 B1 | * | 2/2000 | Khandros et al. ............ | 257/784 |
| 6,064,214 A | * | 5/2000 | Self ............................. | 324/754 |
| 6,066,975 A | * | 5/2000 | Van Loan et al. ........... | 324/758 |
| 6,104,087 A | * | 8/2000 | DiStefano et al. ........... | 257/696 |
| 6,110,823 A | * | 8/2000 | Eldridge et al. ............. | 438/660 |
| 6,150,616 A | * | 11/2000 | Kazama ....................... | 174/267 |
| 6,154,038 A | * | 11/2000 | Ito et al. ...................... | 324/750 |
| 6,166,556 A | * | 12/2000 | Wang et al. ................. | 324/765 |
| 6,191,594 B1 | * | 2/2001 | Nightingale et al. ......... | 324/754 |

FOREIGN PATENT DOCUMENTS

JP 404116943 * 9/1990 ........... H01L/21/60

* cited by examiner

Primary Examiner—N. Le
Assistant Examiner—Wasseem H. Hamdan
(74) Attorney, Agent, or Firm—Armstrong, Westerman & Hattori, LLP (57) ABSTRACT

An examining structure for a circuit protective element comprises a plurality of conductive plates 3 of a conductive circuit 2 which is formed in a pattern on a circuit board 1, a pair of lead terminals 8 provided in the circuit protective element and respectively connected to the conductive plates 3, a test probe 4 for supplying a large current to the lead terminals 8 in order to examine a normal operation of the circuit protective element, and a test pad 6 soldered to the conductive plate 3 which is connected to the lead terminal, the test pad being adapted to be in contact with the test probe, thereby to constitute a probe contact part 5 having a thickness larger than the conductive plate. The test pad is smaller in size than the surface of the conductive plate and positioned near the lead terminal. The test pad is composed of a plurality of contact members having the same shape so as to keep a contact area with the test probe uniformly. The contact members are arranged uniformly. The contact members are solders arranged on one face of the conductive plate and directly attached to and projecting from the conductive plate. The solders may be formed at an opening of a through hole formed in the conductive plate by filling it in the opening.

5 Claims, 7 Drawing Sheets

HIGH CURRENT EXAMINING STRUCTURE FOR A CIRCUIT PROTECTIVE ELEMENT

BACKGROUND OF THE INVENTION

1. Field of the Invention

The present invention relates to a structure for examining and confirming whether a circuit protective element arranged on a circuit board normally operates or not.

2. Description of the Related Art

In a conductive circuit formed in a pattern on an electronic circuit board, a thermistor having a positive resistance temperature characteristic (hereinafter referred to as a PTC thermistor) is used as a circuit protective element for shutting off an overcurrent. The PTC thermistor is such a resistor that a no-load resistance value sharply increases with a rise of temperature. In other words, when an overcurrent flows in the conductive circuit connected to the PTC thermistor, the temperature of the PTC thermistor itself is raised by heat generated at the conductive circuit. The rise of the heat will sharply increase the resistance value of the PTC thermistor, and the PTC thermistor controls a current value of the current flowing through the conductive circuit, which is hereinafter called as "normal operation". The circuit board will be thus protected.

However, if a product installed with the PTC thermistor is defective, that is, the PTC thermistor does not operate normally, it will not be active when the overcurrent flows into the conductive circuit. In the worst case, there is an anxiety that the circuit board may fire. Therefore, an examination must be conducted prior to a shipment of the product, as to whether the PTC thermistor on the circuit board normally operates or not.

Figure 12:
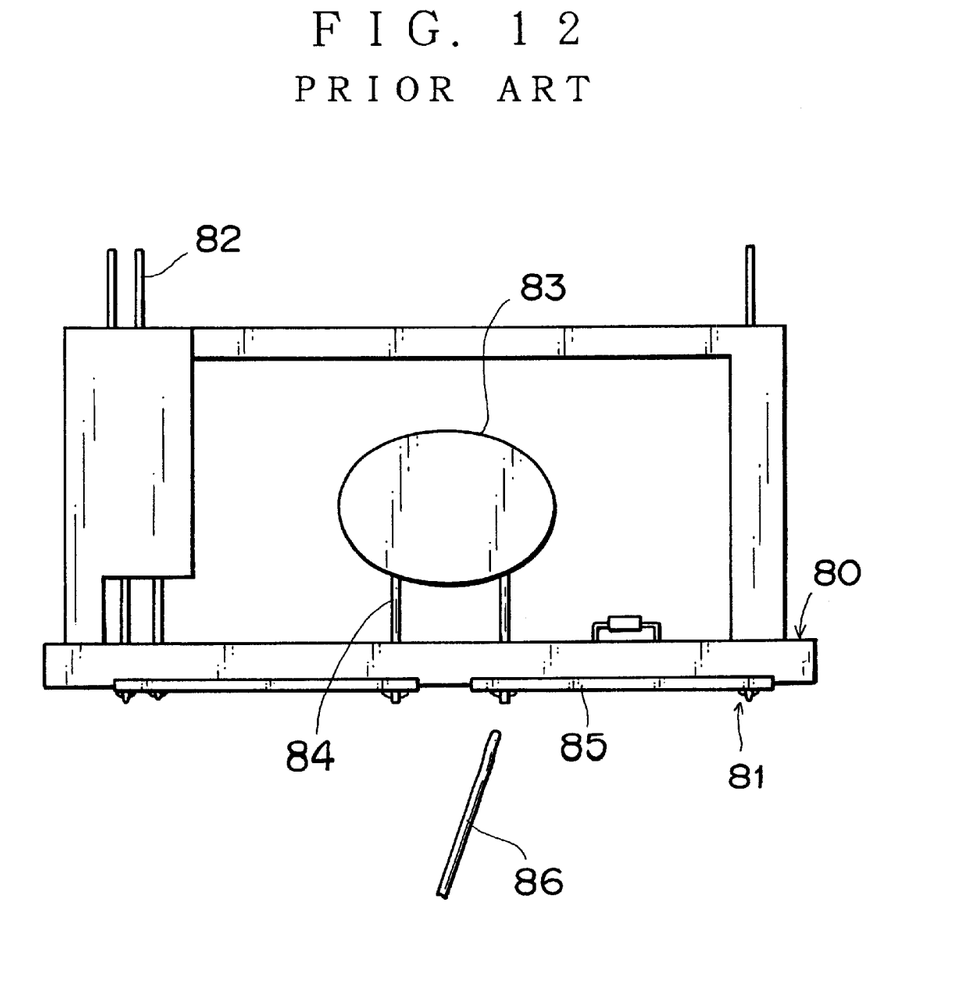
FIG. 12 is a front view of the conventional structure.

Conventionally, the following methods have been proposed as methods for supplying a large current for examination to the PTC thermistor in the product: namely, as shown in FIG. 12, a first method of supplying the examining large current from terminals 82 which are soldered to a conductive circuit 81 on a circuit board 80, or a second method of supplying the examining large current directly to lead terminals 84 of a PTC thermistor 83, or a third method of supplying the examining large current by directly bringing a test probe 86 into contact with conductive plates 85. The large current for examining purpose (for example 100 ampere) is a current larger (more intense) than the overcurrent.

However, in the first method, current value of the large current cannot substantially exceed an admitted current value of the terminals 82. Therefore, there has been a drawback that it takes a long time for the PTC thermistor 83 to start the normal operation, and the examining period will be longer. In the second method, it is sometimes impossible to directly bring the probe 86 in contact with the lead terminal 84 because of a position where the PTC thermistor 83 is arranged. In the third method, the conductive plate 85 is too thin to bear the large current.

SUMMARY OF THE INVENTION

In view of the foregoing, it is an object of the present invention to provide a structure for examining a circuit protective element which can reliably examine and confirm a normal operation of the circuit protective element (PTC thermistor), and enables high grade products to be manufactured at a low cost.

In order to attain the above described object, there is provided according to the present invention, an examining structure for a circuit protective element comprising a plurality of conductive plates of a conductive circuit which is formed in a pattern on a circuit board, a pair of lead terminals provided in the circuit protective element and respectively connected to the conductive plates, a test probe for supplying a large current to the lead terminals in order to examine a normal operation of the circuit protective element, and a test pad soldered to the conductive plate which is connected to the lead terminal, the test pad being adapted to be in contact with the test probe, thereby constituting a probe contact part having a thickness larger than the conductive plate.

According to another feature of the present invention, the test pad is smaller than a surface of the conductive plate and is positioned near said lead terminal.

According to a further feature of the invention, the test pad includes a plurality of contact members having the same shape thereby to keep a contact area with the test probe uniformly.

According to a still further feature of the invention, the contact members are uniformly arranged.

According to a still further feature of the invention, the contact members are uniformly arranged on one face of the conductive plate, and include solders attached directly to and projecting from the one face.

According to another feature of the invention, the solders includes a solder filled in a through hole formed in the conductive plate thereby to form the solder at an opening of the through hole.

DESCRIPTION OF THE PREFERRED EMBODIMENTS

Now, preferred embodiments of the present invention will be explained with reference to the accompanying drawings.

FIGS. 1 to 5 show an embodiment of the examining structure for the circuit protective element according to the present invention. In this embodiment, the case where a PTC thermistor is employed as the circuit protective element will be described.

Figure 1:
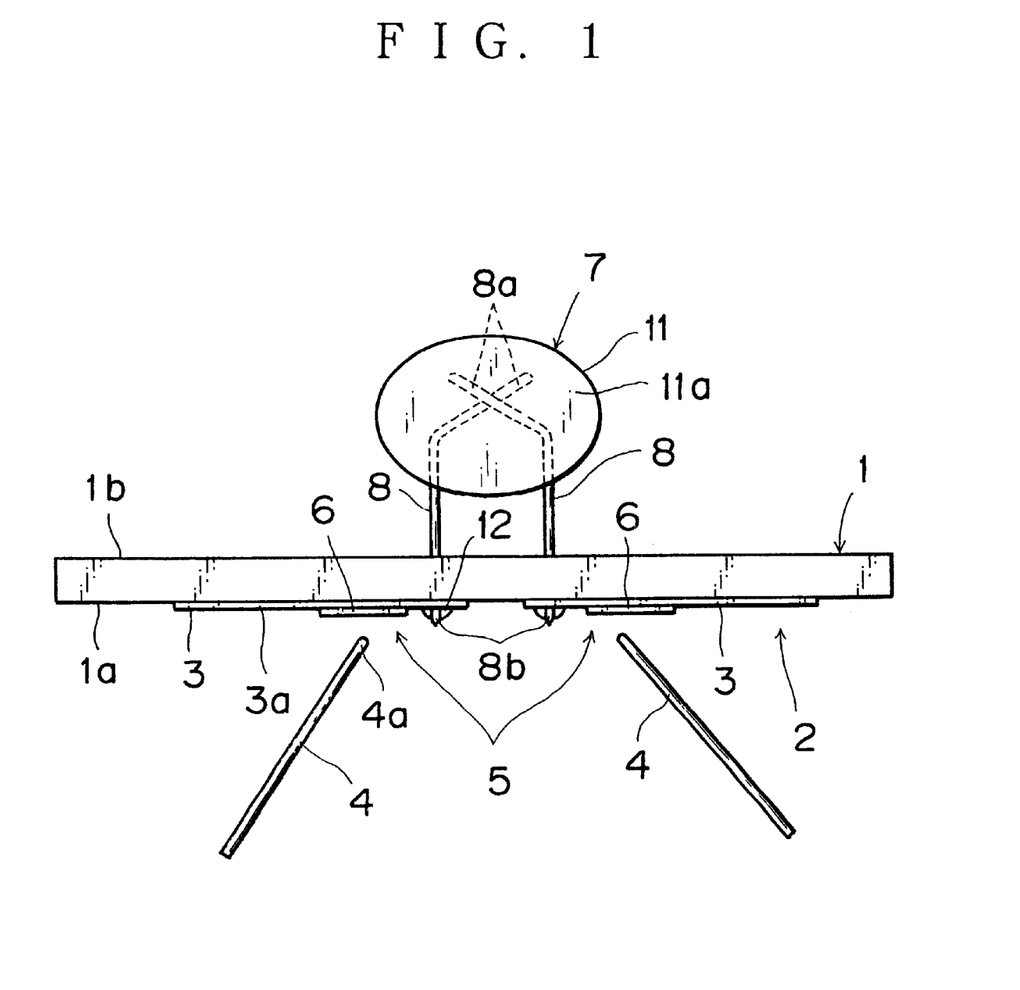
FIG. 1 is a front view of an examining structure for a circuit protective element which is one embodiment according to the present invention.
Figure 2:
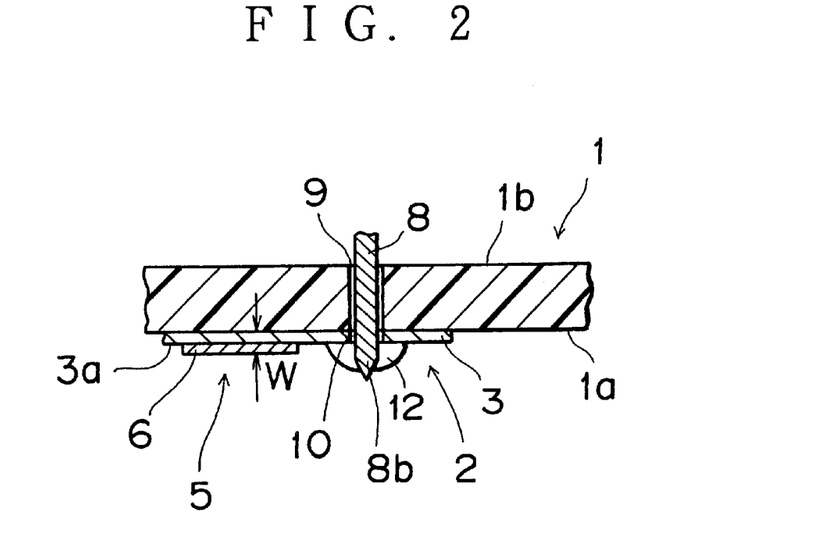
FIG. 2 is an enlarged sectional view showing a probe contact part in FIG. 1.

As shown in FIGS. 1 and 2, the examining structure includes probe contact parts 5 formed by soldering test pads 6 on conductive plates 3 of a conductive circuit 2 which is formed in a pattern on a circuit board 1. Probes 4 are adapted to directly contact the test pads 6 in order to examine and confirm a normal operation of the PTC thermistor 7 which is fixedly connected to the conductive circuit 2.

The circuit board 1 is provided with the conductive circuit 2 formed in a pattern on its one face 1a or on its opposite faces 1a and 1b. The conductive circuit 2 is composed of a plurality of the conductive plates 3. Terminal holes 9 are formed in the circuit board 1 and connecting holes 10 corresponding to the terminal holes 9 are respectively formed in the conductive plates 3.

The PTC thermistor 7 has a thermistor body 11 formed of a semi-conductive material and a pair of lead terminals 8, 8 mounted on the thermistor body 11. The lead terminals 8 are positioned on opposite faces of the thermistor body 11. Each of the lead terminals 8 is fixed at its one end 8a to the thermistor body 11 and at the other end 8b to the conductive plate 3 by soldering. The pair of the lead terminals are connected to two different conductive plates 3 respectively by soldering at 12.

Figure 3:
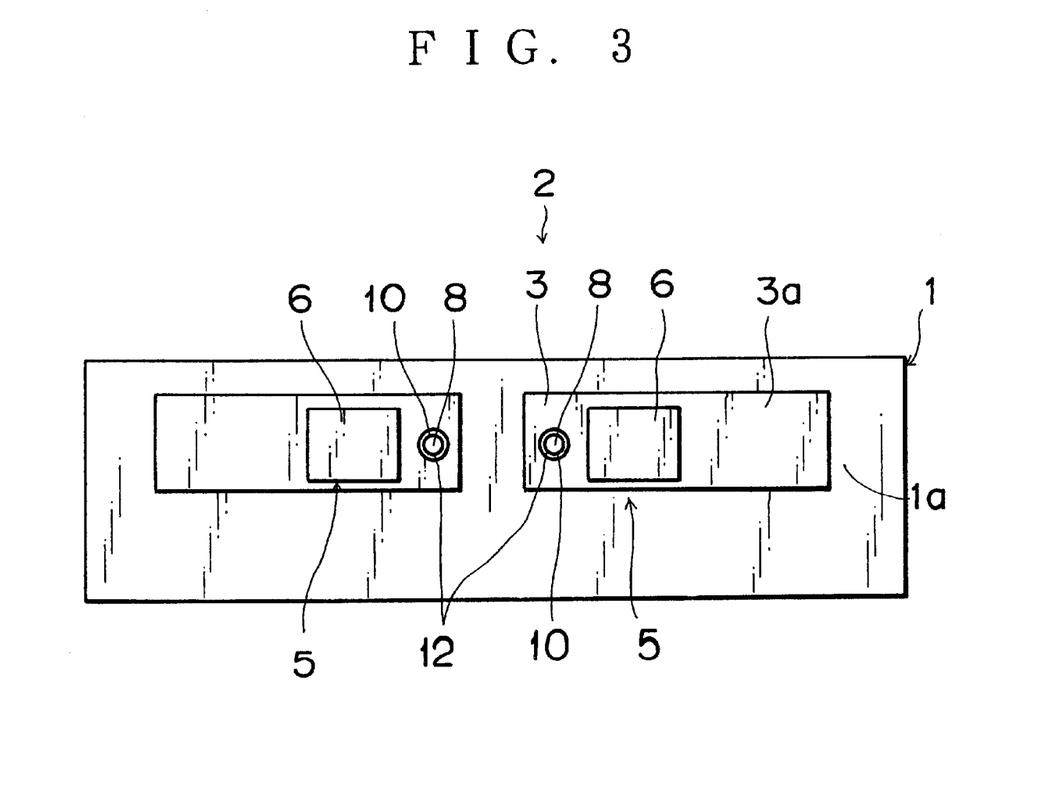
FIG. 3 is a bottom view of FIG. 1.

As shown in FIGS. 1 to 3, the probe contact part 5 consists of the conductive plate 3 and the test pad 6 soldered on an exposed surface 3a of the conductive plate 3. The probe contact part 5 is thus formed on the conductive plate 3 which is fixed by soldering to the lead terminal 8.

The test pad 6 is fixed by soldering directly to the surface 3a of the thin conductive plate 3 near the connecting hole 10. The test pad 6 is smaller in size than the conductive plate 3. A thickness W of the probe contact part 5 can be made larger in this way, by providing the test pad 6 on the thin conductive plate 3, thus allowing the probe contact part 5 to bear the large current. For this reason, the conductive plate 3 will not be damaged even with such large current as will normally operate the PTC thermistor 7, and the circuit board 1 will not be damaged accordingly. An outer shape of the test pad 6 is rectangular in this embodiment, but it can be in any other shape.

Electric resistance of the test pad 6 can be decreased to the least, because the test pad 6 is smaller than the surface 3a of the conductive plate 3. When the probe 4 contacts the test pad 6, the damage on the conductive plate 3 by the large current will be also reduced to the least, because the test pad 6 is positioned near the lead terminal 8. Therefore, the PTC thermistor 7 can perform the normal operations free from influences of the soldering of the test pad 6.

Further, whether or not the PTC thermistor 7 is normally operating can be examined and confirmed in a short time, since the large current which is more intense than the overcurrent flows into the PTC thermistor 7 through the test pad 6. Thus, the examining time can be substantially reduced.

Moreover, due to the fact that the test pad 6 is positioned near the connecting hole 10, the damage on the conductive plate 3 by the large current can be reduced to the least. The reason why the test pad 6 is not directly fitted to the solder 12 is to allow the PTC thermistor 7 to sensitively react to the overcurrent flowing through the conductive plate 3.

Figure 4:
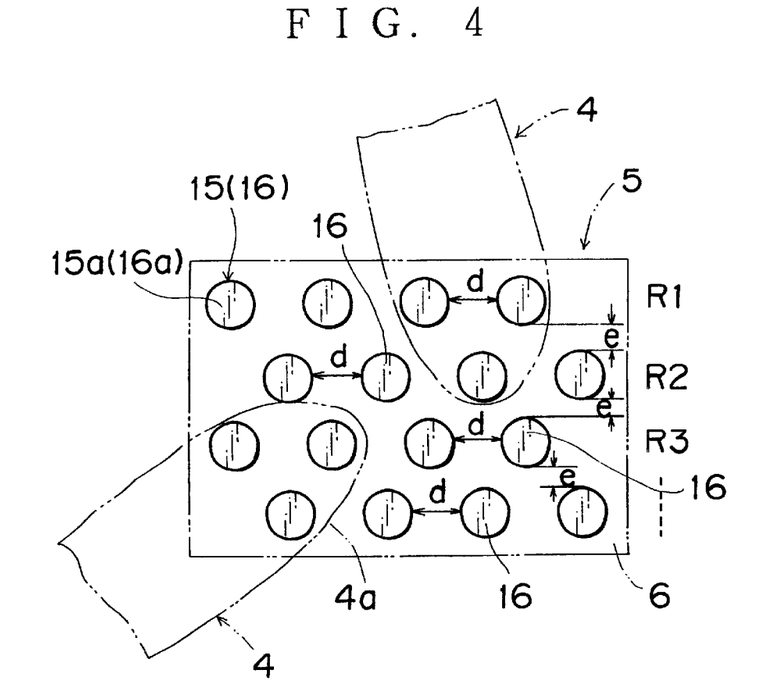
FIG. 4 shows another example of contact members constituting a test pad in FIG. 3.
Figure 5:
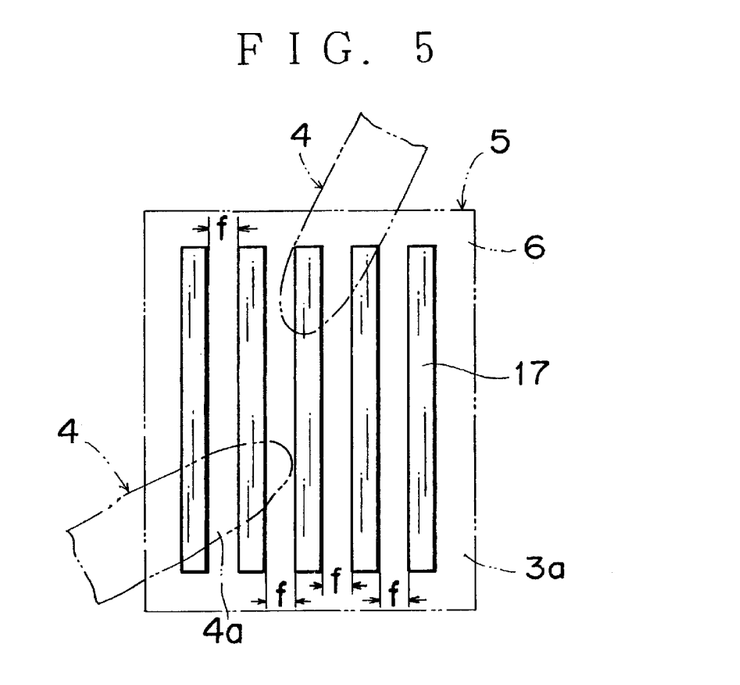
FIG. 5 shows another example of the contact member constituting the pad in FIG. 3.

As shown in FIGS. 4 and 5, the test pad 6 includes a plurality of contact members 15 of the same shape which are put together and uniformly arranged thereon.

With this structure, an area of contact between the distal end 4a of the probe 4 and the surface of the test pad 6, that is, the surface 15a of the contact member 15 can be always maintained uniformly. Accordingly, a stable large current can be supplied from the probe 4 to the test pad 6.

The contact member 15 may be, for example, a thin column 16 as shown in FIG. 4. A plurality of the thin columns 16 are arranged in a row at an equal space d to make a first row R1. The second row R2 of the columns 16 are arranged at a space e from the first row R1, and the columns 16 in the second row R2 are arranged in staggered relation with respect to the columns 16 in the first row R1 at the equal space d. The third row R3 of the columns 16 are also arranged at the equal space d and at the equal space e in staggered relation with respect to the second row R2. A desired number of the rows are arranged in the same manner. A sectional shape of the column 16 may be rectangular or rhombic in addition to round. A dotted line in FIG. 4 represents the distal end 4a of the probe 4. The number of the columns 16 covered with the distal end 4a can be maintained equal, from wherever the probe 4 may come into contact with the contact members 15. In other words, the contact area between the distal end 4a and the test pad 6 can be always kept equal.

Each of the contact members 15 may be in a form of a thin strip 17 as shown in FIG. 5. The thin strips 17 are arranged in a vertical stripe at an equal space f as seen in the drawing. In this case too, the area of the strips 17 covered with the distal end 4a can be maintained equal, from wherever the probe 4 comes into contact with the contact members 15. In other words, the contact area between the distal end 4a and the test pad 6 can be always kept equal. The strips may be arranged in lateral stripes at a desired space therebetween.

Figure 6:
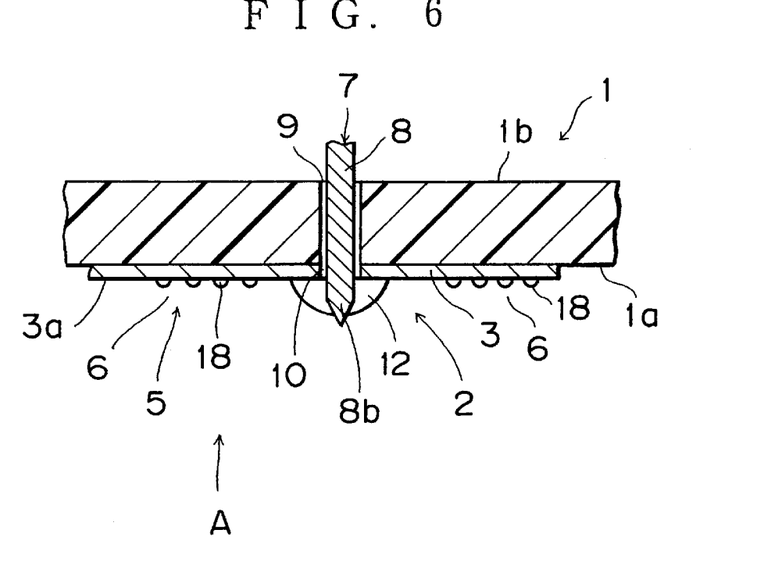
FIG. 6 is a sectional view showing a first modification of the contact member in FIG. 1.
Figure 7:
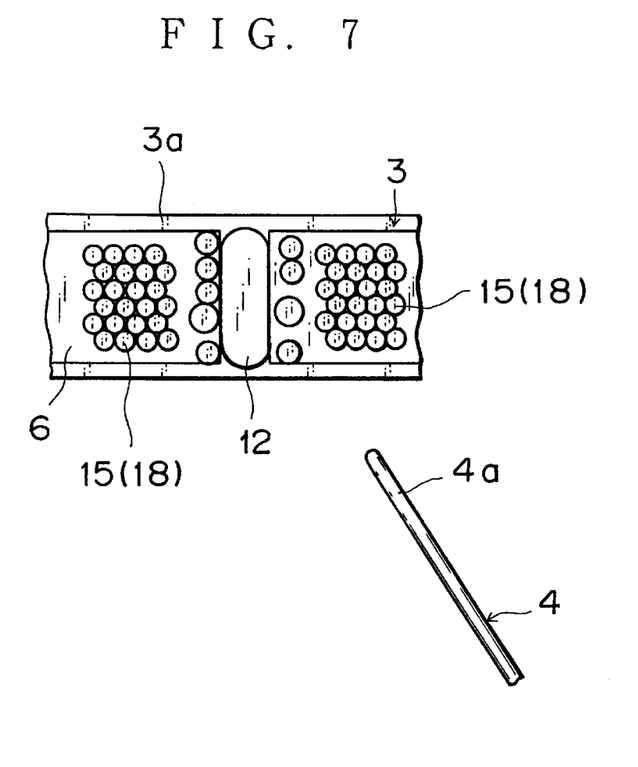
FIG. 7 is s view as seen in a direction of an arrow A of FIG. 6.
Figure 8:
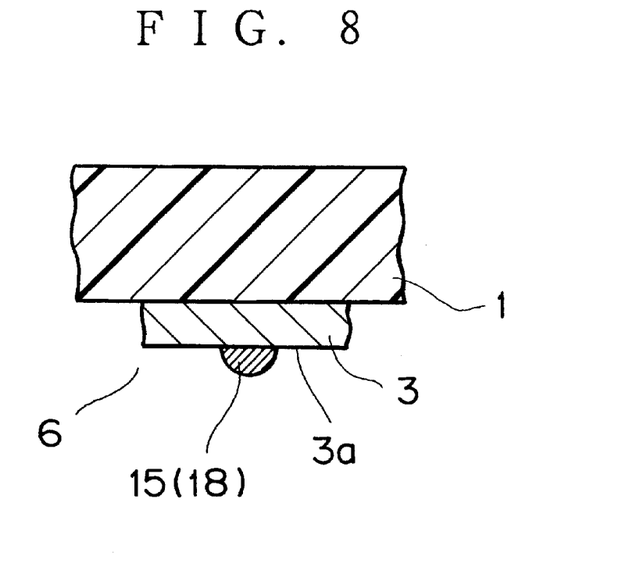
FIG. 8 is an enlarged view of a soldered point in FIG. 6.

FIGS. 6 to 8 show a first modification of the contact member in FIG. 1.

As seen in FIGS. 6 and 7, this type of the contact member 15 includes solders 18 directly attached to the surface 3a of the conductive plate 3 and arranged uniformly.

As seen in FIGS. 7 and 8, each of the solders 18 is formed in a shape of a ball swollen by surface tension on the conductive plate 3 and pressed with a plane in parallel to a plane of the conductive plate 3.

The solder 18 projects from the surface 3a of the conductive plate 3 by attaching it to the surface 3a. Therefore, when the distal end 4a of the probe 4 is brought into contact with the contact member 15, the distal end 4a will not contact the conductive plate 3, but contacts the solder 18 only. Thus, the large current running through the probe 4 will not flow directly into the conductive plate 3.

Further, the test pad 6 can be easily provided on the conductive plate 3 by attaching the solder 18 on the surface 3a of the conductive plate 3, whereby products of high grade can be supplied to the market at a low cost.

Figure 9:
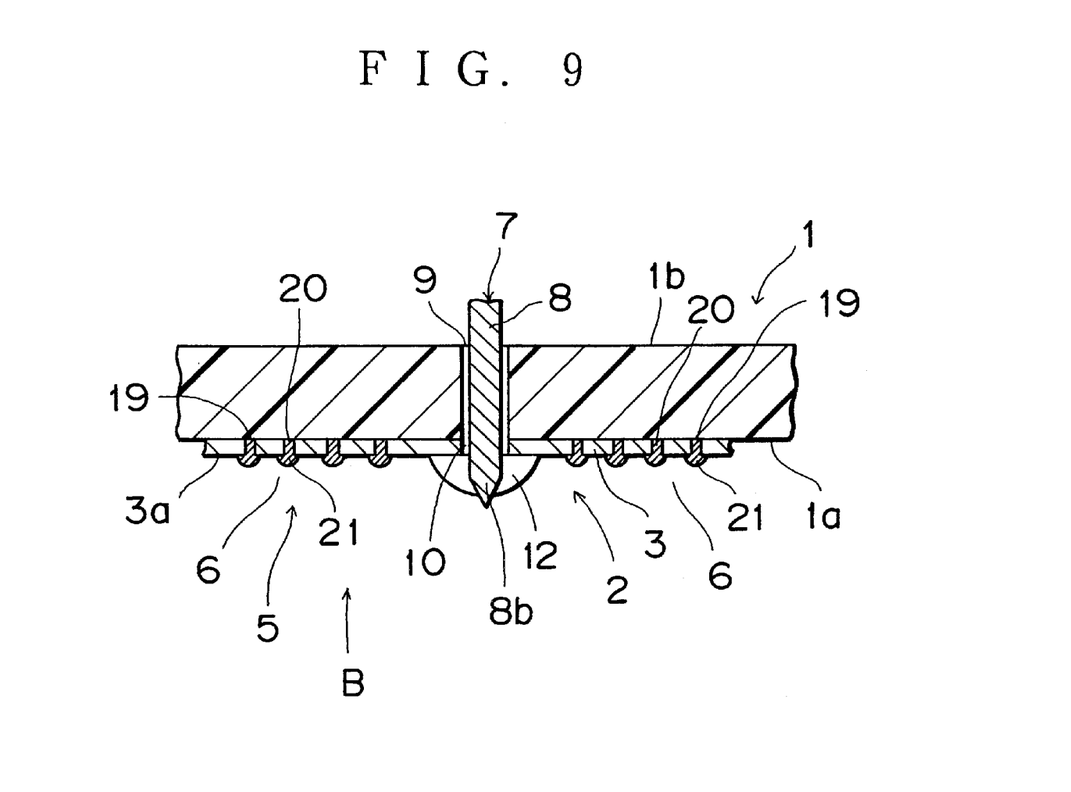
FIG. 9 is an enlarged view showing a second modification of the contact member in FIG. 1.
Figure 10:
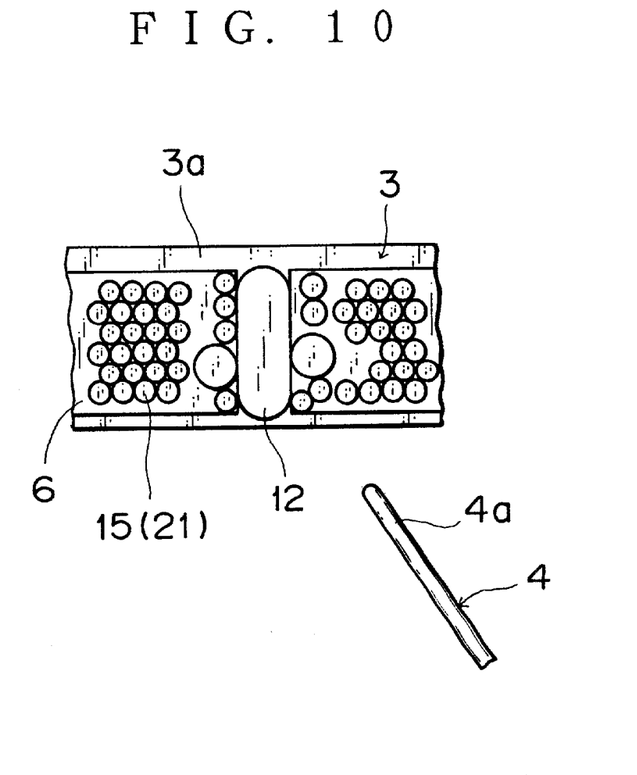
FIG. 10 is a view as seen in a direction of an arrow B of FIG. 9.
Figure 11:
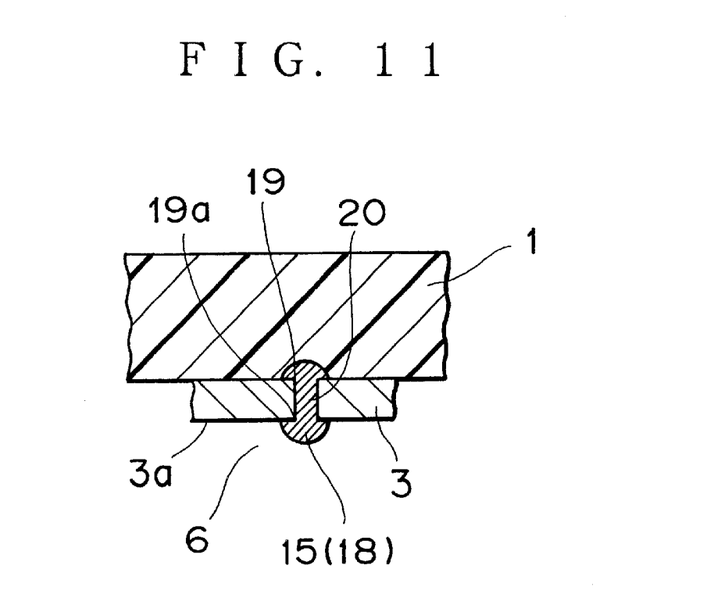
FIG. 11 is an enlarged view showing a soldered point in FIG. 9.

FIGS. 9 to 11 show a second modification of the contact member.

As shown in FIGS. 9 and 10, the contact member 15 includes a plurality of through holes 19 formed uniformly in the conductive plate 3, a solder 20 filled in each of the through holes 19, and a solder 21 attached to an opening 19a of each of the through holes 19.

As seen from FIGS. 10 and 11, after the through hole 19 has been filled with the solder 20, the solder 21 is formed at the opening 19a of the through hole 19. Therefore, the solder 21 exposed at the surface 3a of the conductive plate 3 is larger in size than in the first modification. In this modification, thermal capacity of the solder 21 is larger by such a degree that the solder 20 is filled in the through hole 19. The "thermal capacity" means a quantity of heat necessary for changing temperature of material by one degree, that is, mass of the material multiplied by specific heat. This makes it possible to supply the solder 21 with the large current which is more intense than in the first modification.

By supplying the large current to the solder 21, the PTC thermistor 7 can be examined speedily, the defective PTC thermistor 7 can be excluded efficiently during the assembling step of the product. Reliability of the finished product will be thus increased, that is, the product of high quality can be manufactured.

The above described embodiment is one of means for examining and confirming the normal operation of the PTC thermistor 7, and so, there may be some other means than the described embodiment.

As described above, according to the first feature of the present invention, the probe contact part consists of the conductive plate and the test pad soldered to the conductive plate, so that the thickness of the probe contact part will be larger than that of the conductive plate. Therefore, the probe contact part can sufficiently bear the large current which is supplied when it is brought into contact with the probe. The normal operation of the circuit protective element can be reliably examined and confirmed.

According to another feature of the invention, the test pad is made smaller than the surface of the conductive plate, so that the electric resistance of the test pad can be reduced to the least. Moreover, the test pad is positioned near the terminal, so that the damage on the conductive plate due to the large current can be reduced to the least.

According to still another feature of the invention, the test pad is constituted of a plurality of the contact members having the same shape, so that the contact area between the test probe and the contact members can be kept equal. With this arrangement, the more stable large current can be supplied to the circuit protective element.

According to still another feature of the invention, the contact members are uniformly arranged on the conductive plate, so that the contact area between the test probe and the contact members can be kept equal. With this arrangement, the more stable large current can be supplied to the circuit protective element, thereby enabling the examining time and the examining cost of the circuit protective element to be substantially reduced.

According to still another feature of the invention, the contact members are arranged uniformly on one face of the conductive plate directly by soldering, so that the solders project from the conductive plate. Therefore, when the test probe is brought into contact with the conductive plate, the distal end of the test probe directly contact the solders without contacting the conductive plate, thus avoiding the damage of the conductive plate.

According to still another feature of the invention, the contact members are formed of the solders filled in the through holes in the conductive plate. This increases the amount of the solders as compared with the case wherein the through holes are not provided, to such an extent that the through holes are filled with the solders. The heat capacity of the contact members can be thus increased, whereby the more intense large current can be supplied through the test probe.

The contact members are formed of the solders attached to the conductive plate according to the fifth and sixth features of the invention. Accordingly, the contact members can be manufactured at a low cost, and the intense large current can be supplied therethrough, so that the circuit protective element can be examined reliably avoiding examining errors. Thus the product having the circuit protective element of high quality can be manufactured.

What is claimed is:

1. An examining structure for a circuit protective element comprising;
   a plurality of conductive plate s of a conductive circuit which is formed in a pattern on a circuit board,
   a pair of lead terminals provided in said circuit protective element and respectively connected to said conductive plates,
   a test probe for supplying a large current to said lead terminals in order to examine a normal operation of said circuit protective element, and
   a test pad soldered to said conductive plate which is connected to said lead terminal, said test pad being adapted to be in contact with said test probe, said test pad includes a plurality of contact members, uniformly arranged, having the same shape to keep a uniform contact area with said test probe.
   wherein the structure constitutes a probe contact part having a thickness larger than said conductive plate.

2. An examining structure for a circuit protective element as claimed in claim 1, wherein said test pad is smaller than a surface of said conductive plate and is positioned near said lead terminal.

3. An examining structure for a circuit protective element as claimed in claim 2, wherein said contact members are uniformly arranged on one face of said conductive plate, and include solders attached directly to and projecting from said one face.

4. An examining structure for a circuit protective element as claimed in claim 3, wherein said solders includes a solder filled in a through hole formed in said conductive plate thereby to form said solder at an opening of said through hole.

5. An examining structure for a circuit protective element as claimed in claim 1, wherein the test pad is positioned near a connecting hole so that the damage on the conductive plate by a large current can be reduced to the minimum.

* * * * *